United States Patent [19]

Stankey

[11] Patent Number: 4,845,443
[45] Date of Patent: Jul. 4, 1989

[54] LOW NOISE MULTI-BAND CHANNELIZED MICROWAVE FREQUENCY SYNTHESIZER

[75] Inventor: John E. Stankey, Diamond Bar, Calif.

[73] Assignee: General Dynamics Corporation, Pomona Div., Pomona, Calif.

[21] Appl. No.: 172,822

[22] Filed: Mar. 25, 1988

[51] Int. Cl.$^4$ .......... H03L 7/20; H03L 7/22; H03L 7/18
[52] U.S. Cl. .......... 331/11; 331/19; 331/25
[58] Field of Search .......... 331/10, 11, 12, 19, 331/25

[56] References Cited

U.S. PATENT DOCUMENTS

| | | | |
|---|---|---|---|
| 2,868,981 | 1/1959 | Costas | 331/47 X |
| 2,942,203 | 6/1960 | Winkler | 331/2 |
| 3,268,831 | 8/1966 | Noordanus et al. | 331/2 |
| 3,319,178 | 5/1967 | Broadhead, Jr. | 331/2 |
| 3,320,546 | 5/1967 | Allen et al. | 331/22 |
| 3,480,883 | 11/1969 | Gaunt, Jr. | 332/19 |
| 3,569,838 | 3/1971 | Blair et al. | 331/177 X |
| 4,191,930 | 3/1980 | Harzer | 331/1 A |
| 4,225,829 | 9/1980 | Kumagai | 331/1 A |
| 4,225,830 | 9/1980 | Remy | 331/2 |
| 4,322,692 | 3/1982 | Brewerton et al. | 331/2 |
| 4,358,741 | 11/1982 | Nardin | 331/2 |
| 4,368,437 | 1/1983 | Reuter | 331/2 |
| 4,388,597 | 6/1983 | Bickley et al. | 331/2 |
| 4,409,563 | 10/1983 | Vandegraaf | 331/11 |
| 4,459,560 | 7/1984 | Kurihara | 331/2 |
| 4,488,123 | 12/1984 | Kurihara | 331/2 |
| 4,551,689 | 11/1985 | Scala et al. | 331/2 |
| 4,584,539 | 4/1986 | Stankey | 331/19 X |
| 4,673,891 | 6/1987 | Remy | 331/2 |

FOREIGN PATENT DOCUMENTS 59-135932 8/1984 Japan ........................ 331/2

Primary Examiner—Siegfried H. Grimm
Attorney, Agent, or Firm—Neil F. Martin; Leo R. Carroll

[57] ABSTRACT

The described embodiment of the present invention provides a technique for minimizing unwanted components in the output of a frequency synthesizer. The output signal of the frequency synthesizer is tapped and mixed with a selective reference control signal. The reference control signal is selected by a control logic so that, when mixed with the output signal of the frequency synthesizer, a signal is derived of constant frequency no matter what frequency the frequency synthesizer is set to provide. This constant frequency signal is provided to a power divider. One output of the power divider is provided to a phase shifter which shifts the signal 180 degrees. The other output of the power divider is provided to a high quality band pass filter tuned to the constant frequency. The output of the phase shifter and the high quality band pass filter are recombined, thus cancelling the constant signal while leaving remnants of the undesired frequency drift. This signal is passed through a low pass filter and summed with the control voltage of the voltage controlled oscillator through a DC blocking capacitor. Because the undesired components are provided through the phase shifter, the undesired components degenerate when summed with the control voltage of the voltage controlled oscillator.

4 Claims, 4 Drawing Sheets

LOW NOISE MULTI-BAND CHANNELIZED MICROWAVE FREQUENCY SYNTHESIZER

This application relates to the field of oscillating signal synthesis. More specifically, this application relates to the field of multi-channel frequency synthesis using phase lock loop techniques.

BACKGROUND OF THE INVENTION

The need to generate high accuracy oscillating signals is necessary in radar, radio and other applications. One of the high accuracy signal generation techniques involves the excitation of crystals which then generated a signal having a frequency characteristic of that crystal. However, this technique is limited to the use of one crystal or, if several frequencies were desired, several crystal circuits for each frequency desired would be necessary. This entails a frequency generating circuit for each crystal and, perhaps, could not be accomplished for certain frequencies because, there are no crystals providing that characteristic frequency.

One technique for solving this problem is frequency synthesis. One technique of frequency synthesis uses frequency multiplication and division circuits in combination to generate a multiplicity of frequencies. In more sophisticated techniques a single oscillating output may provide any of a number of output signals on a single output terminal. One such technique is shown in Stankey, U.S. Pat. No. 4,584,539, issued Apr. 22, 1986. In Stankey, a voltage controlled oscillator is fed a DC signal which causes an output signal having an initial imprecise frequency. The output signal of the voltage controlled oscillator is tapped and fed to a mixer where it is mixed with a comb signal generated by a comb generator feeding from a crystal oscillator output. The closest comb signal to the output of the voltage controlled oscillator will produce a relatively low frequency product. The other combinations are filtered out by a low pass filter. The output of the crystal oscillator is divided down to a frequency which provides the desired frequency output signal when added to or subtracted from one of the singlas provided by the comb generator. The rate of frequency division of the frequency divider is selected by logic circuitry. The output of the frequency divider is provided to a phase detector. The other input to the phase detector is the output of the low pass filter. The output of the phase detector is filtered using a common loop filter. The output of the loop filter is combined with the original input voltage to the voltage controlled oscillator. This phase locked loop stabilizes when the output of the voltage controlled oscillator equals the output required from the frequency synthesizer.

Stankey provides a high accuracy, high agility frequency synthesizer (agility is the ability to switch quickly from one frequency to another over a wide range). However, even when locked, minute traces of other frequency components may be provided which causes excessive residual phase noise in the output frequency. It is an object of the present invention to provide a technique for filtering out this residual phase noise.

SUMMARY OF THE INVENTION

The described embodiment of the present invention provides a technique for minimizing unwanted components in the output of a frequency synthesizer. The output signal of the frequency synthesizer is tapped and mixed with a selected reference control signal. The reference control signal is selected by a control logic so that, when mixed with the output signal of the frequency synthesizer, a signal is derived of constant frequency no matter what frequency the frequency synthesizer is set to provide. This constant frequency signal is provided to a power divider. One output of the power divider is provided to a phase shifter which shifts the signal 180 degrees. The other output of the power divider is provided to a high quality band pass filter tuned to the constant frequency. The output of the phase shifter and the high quality band pass filter are recombined, thus cancelling the constant signal while leaving remnants of the undesired frequency modulation components. This signal is passed through a loop filter and summed with the control voltage of the voltage controlled oscillator through a DC blocking capacitor. Because the undesired components are provided through the phase shifter, the undesired components degenerate when summed with the control voltage of the voltage controlled oscillator.

DETAILED DESCRIPTION OF THE INVENTION

Figure 1:
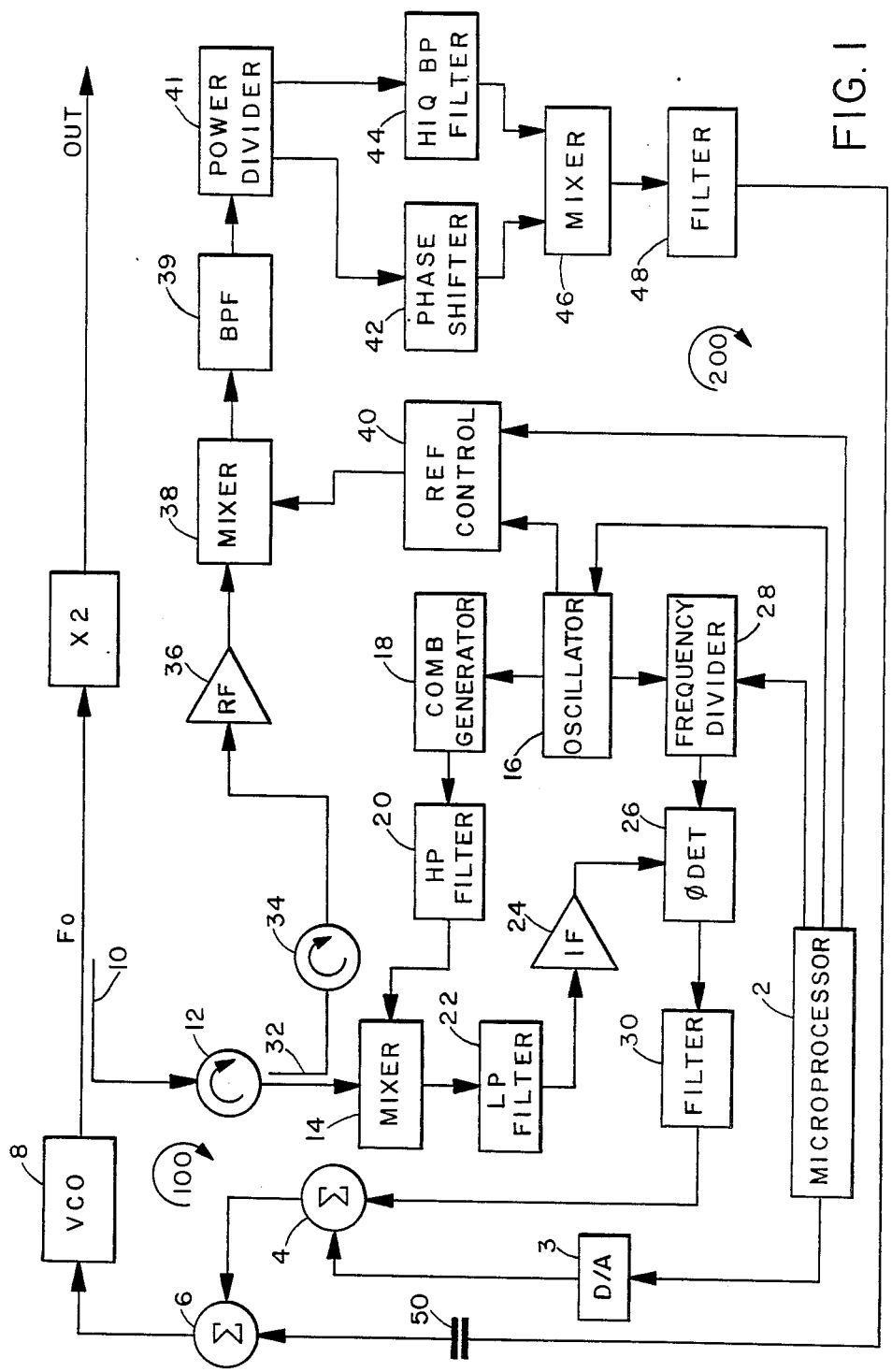
FIG. 1 is a block schematic diagram of a frequency synthesizer including one embodiment of the present invention.

FIG. 1 is a block schematic diagram of a multichannel frequency synthesizer using one embodiment with the present invention to reduce frequency modulated errors. Frequency synthesizer 1 is initiated by providing a selected frequency signal from a microprocessor to digital to analog converter 3. Digital to analog converter 3 provides an analog constant voltage signal which passes through summing node 4 and summind node 6 to voltage controlled oscillator 8. Voltage controlled oscillator 8 produes a signal having a frequency approximately equal to the desired frequency in response to the signal provided from summing node 6. The output of voltage controlled oscillator 8 is tapped by tap 10 which feeds the circulator/isolator 12. The output of circulator/isolator 12 is provided to mixer 14. The other input signal to mixer 14 is provided by oscillator 16 feeding comb generator 18. Comb generator 18 takes the fixed frequency signal provided by oscillator 16 and provides a comb signal where each signal is separated by a frequency equal to the frequency provided by oscillator 16. The output of comb generator 18 is provided to high pass filter 20 which removes the lower frequency signals from the signal provided by comb generator 18 so as to avoid overloading mixer 14. The portion of the signal provided by comb generator 18 which is closest in frequency to the signal provided by voltage controlled oscillator 8 will generate an intermediate frequency component when mixed with the signal from voltage controlled oscillator 8. The high frequency components of the signal provided by mixer 14 are removed by low pass filter 22. The remaining intermediate frequency component is amplified by IF AMP 24 and provided to phase detector 26. The other input signal for phase detector 26 is provided by oscillator 16 through frequency divider 28. The amount of frequency division provided by frequency divider 28 is selected by a singal provided by microprocessor 2 to frequency divider 28. Phase detector 26 provides an output signal which is proportional to the phase difference between the signal provided by IF AMP 24 and frequency divider 28. These signals should be close enough in phase and frequency to provide a low frequency signal component which is allowed to pass through loop filter 30 to summing node 4, thus completing phase locked loop 100. (For a discussion on the operation of loop filters, see Strernler, *Introduction to Communication Systems*, (1977) Addition—Vesley, Section 6.7.2) Phase locked loop 100 will stabilize to a frequency equal to one of the frequencies generated by comb generator 18 plus or minus the frequency provided by frequency divider 28. Thus, the output frequency of voltage controlled oscillator 8 is a frequency following the formula of:

$$F_0 = F_X(N \pm / -1/M)$$

where
- $F_0$ = the output frequency of voltage controlled oscillator 8,
- $F_X$ = the output frequency of oscillator 16,
- N is an integer which corresponds to the nearest comb frequency to the desired frequency, and
- M is the divider factor of frequency divider 28.

Loop 200 begins with the signal provided by tap 32 to ciruclator/isolator 34. This signal is provided to RF AMP 36 which is provided to mixer 38. The other input to mixer 38 is provided by reference control 40. The operation of reference control 40 is discussed with regard to FIG. 2 below. Reference control 40 is designated so that the output signal which is mixed with the output signal of voltage controlled oscillator 8 always provides a signal centered at frequency $F_d$ which carries corresponding frequency components to that of the output of voltage controlled oscillator 8. The output signal of mixer 38 is provided to band pass filter 39. Band pass filter 39 is a rough filter having a center frequency at $F_d$. The output signal of band pass filter 39 is provided to power divider 41 which provides an equal power signal to phase shifter 42 and high quality band pass filter 44. Phase shifter 42 provides 180 degree phase shift. Band pass filter 44 is a high quality (high Q) band pass filter centered at $F_d$ which eliminates most of the components of the input signal excepting $F_d$. Because the signal provided by phase shifter 42 is out of phase 180 degrees, when these two signals are mixed in mixer 46, the frequency components near $F_d$ are generally cancelled. In the output of mixer 46, a very low frequency component representative of the FM drift of voltage controlled oscillator 8 is included. Loop filter 48 conditions the output signal of mixer 46 and the output signal of loop filter 48 is provided to summing node 6 via DC blocking capacitor 50. The signal provided by filter 48 is opposite but approximately equal to the FM drift component present on the signal provided by summing node 4. Thus, the FM drift component is cancelled before being provided to voltage controlled oscillator 8. This minimizes the noise component and improves the stability and quality of the output in the voltage controlled oscillator 8 and thus, frequency synthesizer 1.

Figure 2:
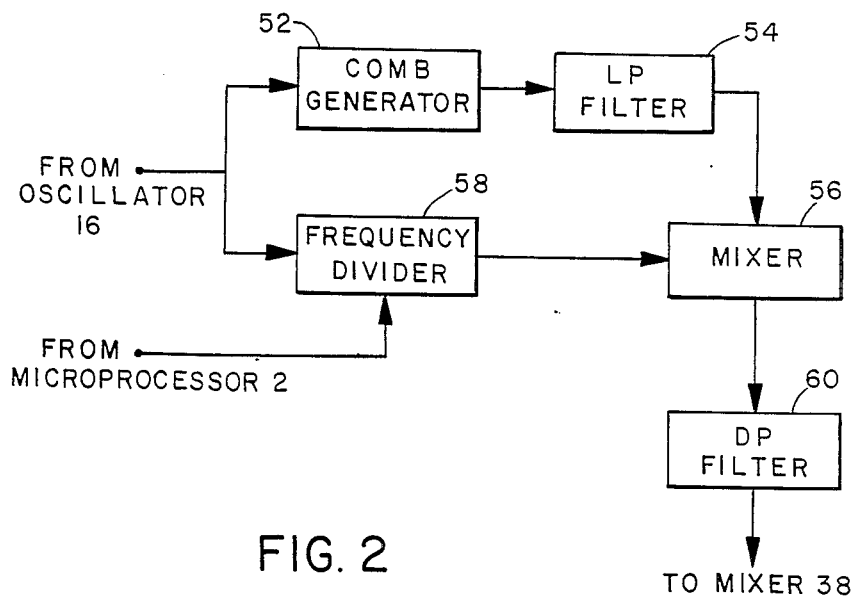
FIG. 2 is a block diagram of the reference control generator of FIG. 1.

FIG. 2 is a block schematic diagram of reference control generator 40 of FIG. 1. Comb generator 52 provides a comb output signal having X comb components, where X is less than N, spaced by a frequency equal to the frequency to the signal provided from oscillator 16. The high frequency components at the output of generator 52 are removed by low pass filter 54 and the output signal of filter 54 is provided to mixer 56. Frequency divider 58 provides a signal which is the input signal provided by oscillator 16 divided by an amount selected by a signal from microprocessor 2. The output of frequency of divider 58 is provided to mixer 56. The output of mixer 56 is provided to band pass filter 60 having a center frequency equal to $F_d$.

X is an integer that is much less than N. M is the same M used in divider 28. $F_d$ is chosen so that $F_d = LF_x$ and $L < N - X$. When $F_o$ is combined with the output of reference control 40, upper and lower sidebands are created. The upper sideband is filtered out by band pass filter 39. Upper and lower sidebands are also created for all multiples of $F_x X$; these are all filtered out except for one which conforms to the formula $F_y = F_o = F_d$. This formula can be rearranged to $F_d = F_o - F_y$. Substantially for $F_o$ and $F_y$, $F_d = F_x(N \pm 1/M) - F_x(I \pm \pm 1/M)$ where I is an integer less than X. Because one of the $\pm 1/M$'s will correspond to the desired frequency, these frop out of the equation. Dividing by $F_x$ results in $L = N - I$. Because comb generator 52 produces all integral multiples of $F_x$ up to X and $X > I$, the product of mixer 38 will always produce a signal at $F_d$. This allows the use of high quality band pass filter 44 having a frequency center at $F_d$ to combine with phase shifter 42 and mixer 46 to provide a signal representative of the drift of voltage controlled oscillator 8.

Figure 3:
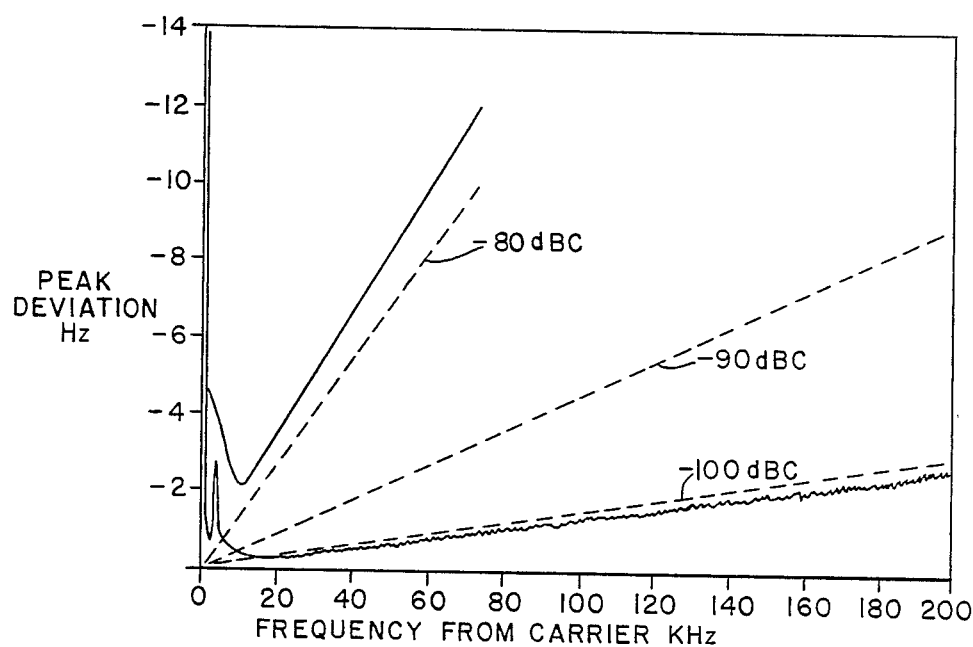
FIG. 3 is a graph showing the relationship of the undesired frequency components as the frequency deviation from the desired frequency.
Figure 4:
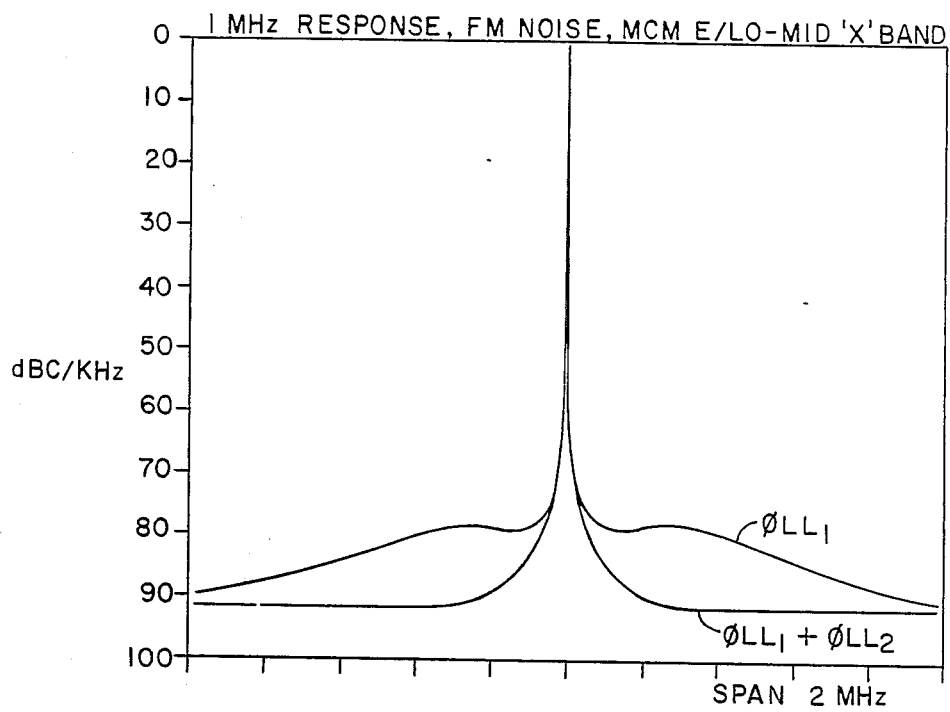
FIG. 4 is a graph showing the frequency spectrum of the output of a frequency synthesizer at ±1 megahertz bandwidth both with and without the described embodiment of the present invention.
Figure 5:
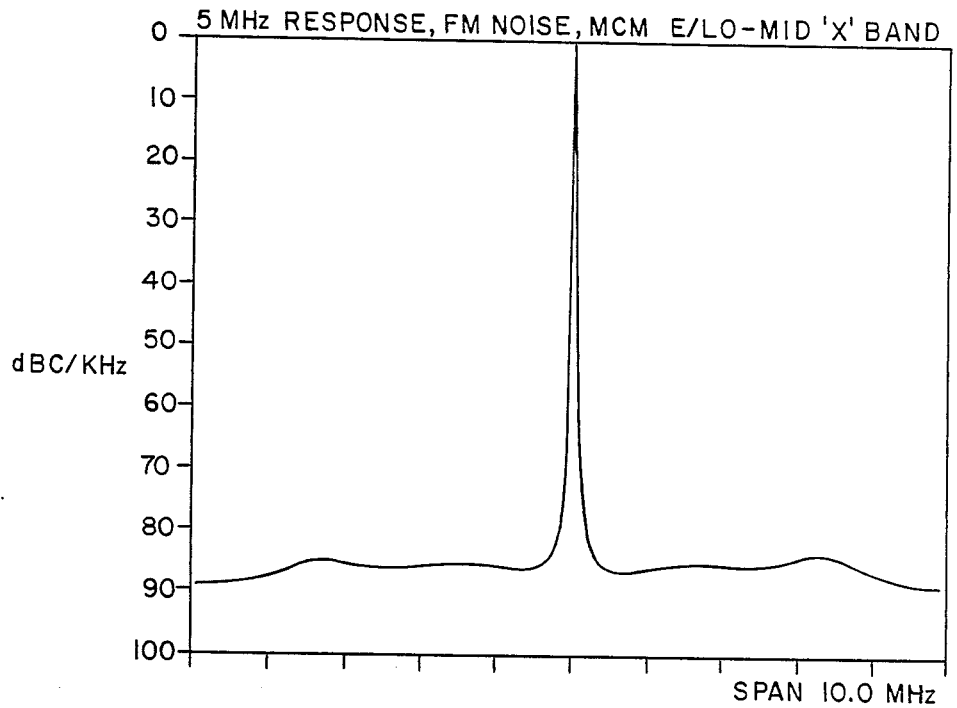
FIG. 5 is a graph showing the frquency spectrum of the output of a frequency synthesizer at ±5 megahertz bandwidth using the described embodiment of the present invention.
Figure 6:
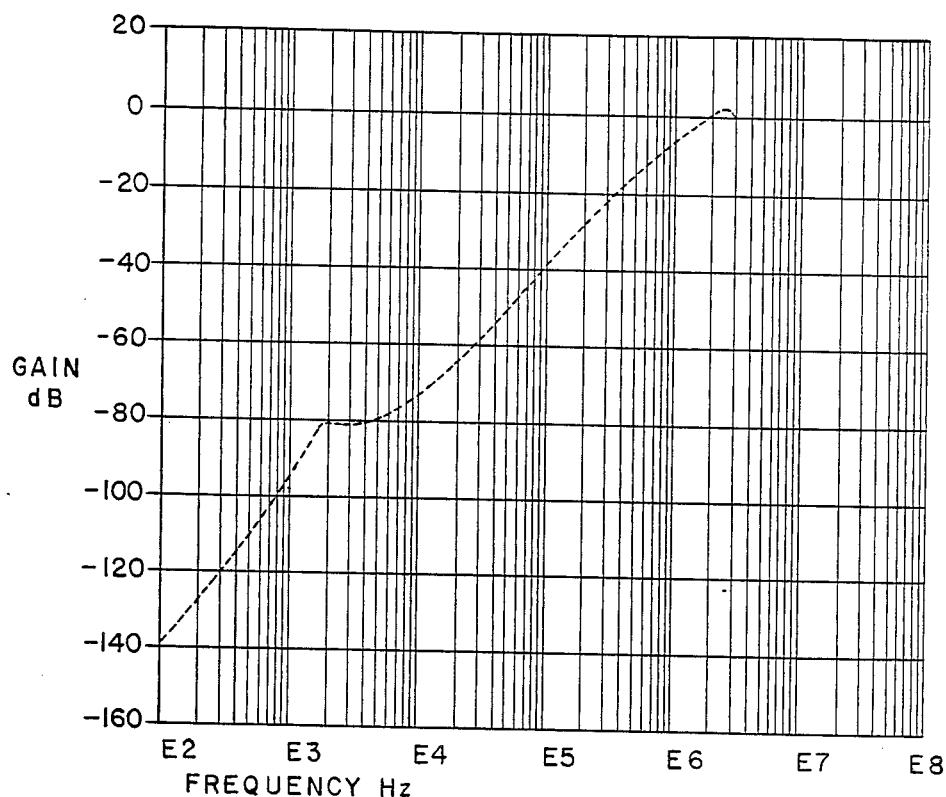
FIG. 6 is a graph showing the combined degeneration gain transfer characteristics of the two loop filters.

The results of this technique can be seen in FIGS. 3 through 5. FIG. 3 is a graph indicating the noise suppression of a multi-channel frequency synthesizer using error correction loop 200 and not using error correction loop 200. As can be seen, error correction loop 200 provides approximately 20 dbc additional noise suppression. FIG. 4 is a spectral graph of a frequency synthesizer such as frequency synthesizer 1 both with and without loop 200 when frequency synthesizer 1 provides an output of 1 megahertz. As can be seen, the output of frequency synthesizer 1 drops quickly to below 90 decibels below the output signal on either side of the frequency. The equipment used to measure the frequency spectrum has a range of resolution of approximately 90 decibels. Thus, the actual output signal of nonselected frequencies is probably less than 90 decibels below the output of the selected frequency but the spectrum analyzer was unable to detect those signals. FIG. 5 is a spectrum diagram of the output of frequency synthesizer 1 using loop 200 where frequency synthesizer 1 is providing an output signal of $\pm/5$ megahertz bandwidth. FIG. 6 is a log scale diagram of the degeneration gain of frequency synthesizer 1. This graph represents the possible reduction (degeneration) in the open loop FM noise of the frequency synthesizer of loop 100.

Although a specific embodiment is described, the scope of the claimed invention is not to be limited to the description herein. The scope of the claimed invention is only limited by the claims appended hereto.

I claim:

1. A frequency synthesizer comprising:
a first voltage controlled oscillator having a control voltage input terminal and having a frequency output terminal;
control voltage generation means for generating a control voltage signal corresponding to a selected frequency and providing said control voltage signal on a control voltage output terminal;
a reference oscillator for generating a second selected frequency having a frequency output terminal, said second selected frequency differing by a fixed frequency from said first selected frequency;
first mixer having a first input terminal connected to said frequency output terminal of said first voltage controlled oscillator, a second input terminal connected to said frequency output terminal of said reference oscillator and having an output terminal;
a first band pass filter having an input terminal connected to said output terminal of said first mixer and having an output terminal, said band pass filter having a band pass frequency centered around said fixed frequency;
a power divider having an input terminal connected to said output terminal of said band pass filter and having first and second output terminals providing equivalent signals on said first and second output terminals;
a phase inverter having a first input terminal connected to said first output terminal of said power divider and having an output terminal;
a second band pass filter having a narrower band pass range than said first band pass filter and having a center frequency at said fixed frequency, having an input terminal connected to said second output terminal of said power divider and having an output terminal;
a second mixer having a first input terminal connected to said output terminal of said phase inverter, a second input terminal connected to said output terminal of said second band pass filter and having an output terminal; and
a summing node having a first input terminal connected to said output terminal of said second mixer, a second input terminal connected to said control voltage output terminal of said control voltage generation means, and an output terminal connected to said control voltage input terminal of said voltage controlled oscillator.

2. The frequency synthesizer of claim 1 wherein said control voltage generation means comprises phase detection means having a first input terminal connected to the output terminal of said voltage controlled oscillator, a second input terminal connected to a reference frequency source and an output terminal serving as said control voltage output terminal providing an output signal indicative of the phase relationship of the signal provided on said first and second input terminals.

3. A frequency synthesizer as in claim 1 where said frequency synthesizer provides a signal on said frequency output terminal in the RF band.

4. A multi-channel frequency synthesizer comprising:

a source oscillator for providing a fixed signal having a fixed frequency;
a first comb generator receiving said fixed signal for generating a first comb signal having frequencies based on integral multiples up to an integer N of the frequency of said fixed signal;
a frequency divider receiving said fixed signal for providing a divided signal having a frequency which is a quotient of the frequency of said fixed signal;
a voltage controlled oscillator for providing an output signal in response to the voltage of a input signal; and
selection means for providing an output voltage which causes said voltage controlled oscillator to operate within a preselected range of a selected frequency;
a first mixer for mixing the output signal of said voltage controlled oscillator with said comb signal;
a first low pass filter for passing the lower frequency product of said output signal of said voltage controlled oscillator and said comb signal as provided by said mixer;
a phase detector having a first input signal provided by said first low pass filter, a second input signal provided by said frequency divider and providing an output signal having a voltage proportional to the phase differential of said first and second input signals;
a first summing node for providing an output signal which is the sum of said output of said selection means and the output signal of said phase detector;
a second comb generator receiving said fixed signal for providing a second comb output signal having frequencies based on integral multiples up to an integer X of said fixed frequency;
a second frequency divider receiving said fixed signal for providing a second divided signal which is a quotient of said fixed frequency;
a second mixer for mixing said second comb signal and said second divided signal to provide a second mixed signal;
a third mixer for mixing the output signal of said voltage controlled oscillator with said second mixed signal to provide a third mixed signal;
a phase reverser having said third mixed signal as an input signal and a phase reversed signal as an output signal;
a high Q band pass filter receiving said third mixed signal and having a fixed band centered at a frequency $F_d$, where $F_d$ is an integral multiple L of said fixed frequency and L is less than $N-X$ and having a filter signal as an output signal;
a fourth mixer having said phase reversed signal as a first input signal and said filter signal as a second input signal and a fourth mixed signal as an output signal;
a capacitor for blocking DC signals having a first plate connected to receive said fourth mixed signal and a second plate; and
a second summing node having a first input signal provided on an output terminal connected to said second plate of said capacitor, having said output signal of said first summing node as a second input singla, and providing a sum signal of said first and second input signals as said input signal of said voltage controlled oscillator.

* * * * *